United States Patent
Huang et al.

(10) Patent No.: US 8,391,063 B2
(45) Date of Patent: Mar. 5, 2013

(54) METHOD OF OPERATING MEMORY CELL

(75) Inventors: Yu-Fong Huang, Tainan (TW);
Teng-Hao Yeh, Hsinchu (TW);
Miao-Chih Hsu, Taichung (TW);
Tzung-Ting Han, Yilan County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 279 days.

(21) Appl. No.: 12/835,075

(22) Filed: Jul. 13, 2010

(65) Prior Publication Data
US 2011/0255350 A1 Oct. 20, 2011

(30) Foreign Application Priority Data

Apr. 14, 2010 (CN) .......................... 2010 1 0148674

(51) Int. Cl.
*G11C 11/34* (2006.01)
(52) U.S. Cl. ......... 365/185.03; 365/185.18; 365/185.28; 365/185.29
(58) Field of Classification Search ............. 365/185.03, 365/185.18, 185.28, 185.29
See application file for complete search history.

(56) References Cited

U.S. PATENT DOCUMENTS

| 6,486,028 | B1 | 11/2002 | Chang et al. | 438/259 |
| 7,220,634 | B2* | 5/2007 | Prall et al. | 438/216 |
| 2007/0161193 | A1* | 7/2007 | Hsu et al. | 438/259 |

OTHER PUBLICATIONS

Chang Woo Oh et al., "4-Bit Double SONOS Memories (DSMs) Using Single-Level and Multi-Level Cell Schemes" Electron Devices Meeting, 2006, IEDM '06 International, pp. 1-4.

* cited by examiner

*Primary Examiner* — Pho M Luu
*Assistant Examiner* — Thao Bui
(74) *Attorney, Agent, or Firm* — J.C. Patents

(57) ABSTRACT

A method of operating a memory cell is provided. The memory cell has first, second, third and fourth storage regions in a charge-storage layer between a substrate and a word line. The first and second storage regions are respectively adjacent to lower and upper portions at one side of the protruding part of the substrate, and the third and fourth storage regions are respectively adjacent to lower and upper portions at the other side of the same. The second and third storage regions are regarded as a top storage region. When the top storage region is programmed, a first positive voltage is applied to the word line, a second positive voltage is applied to a top bit line in a top portion of the protruding part, and a bottom voltage is applied to first and second bottom bit lines in the substrate beside the protruding part respectively.

15 Claims, 2 Drawing Sheets

METHOD OF OPERATING MEMORY CELL

CROSS-REFERENCE TO RELATED APPLICATION

This application claims the priority benefit of China application serial no. 201010148674.8, filed on Apr. 14, 2010. The entirety of the above-mentioned provisional application is hereby incorporated by reference herein and made a part of this specification.

BACKGROUND OF THE INVENTION

1. Field of Invention

The present invention relates to a method of operating a memory cell, and more generally to a method of operating a vertical memory cell.

2. Description of Related Art

A memory is a semiconductor device designed for storing information or data. As the functions of computer microprocessors become more and more powerful, programs and operations executed by software are increasing correspondingly. Consequentially, the demand for high storage capacity memories is getting more. Among various types of memory products, a non-volatile memory such as an electrically erasable programmable read only memory (EEPROM) allows multiple-time data programming, reading and erasing operations, and the data stored therein can be retained even after the power of the memory is interrupted. With these advantages, EEPROM has become one of the most widely adopted memories for personal computers and electronic equipment.

Typical EEPROM is composed of a floating gate and a control gate, which are made of doped polysilicon. When the memory is programmed, the electrons injected into the floating gate uniformly distributes in the polysilicon floating gate. However, when defects exist in the tunnel oxide layer under the polysilicon floating gate, a leakage is easily generated in the device, and the reliability of the device is decreased.

In order to solve the leakage problem of the EEPROM, one known method is adopting a stacked gate structure including a non-conductive charge-storage layer instead of the polysilicon floating gate. Another advantage obtained from replacing the polysilicon floating gate with the charge-storage layer is that the electrons are only stored in a portion of the charge-storage layer over the channel region adjacent to the source region or drain region while the device is programmed. Therefore, during the programming process, the voltages can be applied to the source region and the control gate respectively. Hence, the electrons are stored in a portion of the charge-storage layer near the drain region with a form of Gaussian distribution. Alternatively, the voltages can be applied to the drain region and the control gate respectively. Hence, the electrons are stored in a portion of the charge-storage layer near the source region with a form of Gaussian distribution. In the other words, there are two storage regions in the charge-storage layer. By properly applying the voltages to the control gate and to either the source region or the drain region, there can be four different storage states, which includes each of the storage regions having one group of electrons with a Gaussian distribution property, either one of the storage regions having one group of electrons with a Gaussian distribution property and none of the electrons stored in both storage regions, in the charge-storage layer. That is, a single flash memory cell can present four different storage states. Hence, instead of using the floating gate, the flash memory with a charge-storage layer is considered a 2-bit-per-cell memory.

In order to increase the number of bits of a memory cell, a memory structure with a vertical memory cell is developed. This kind of memory cell is a 4-bit-per-cell flash memory. However, in the memory structure with the vertical memory cell, when the selected bit is programmed, interference to other bits is generated by the conventional technique. Therefore, the selected bit and non-selected bits are indistinguishable, so that the purpose of storing multiple bits is hardly achieved.

SUMMARY OF THE INVENTION

Accordingly, in an embodiment of the present invention, a method of operating a memory cell is provided, in which three bits are stored in a single memory cell.

In an embodiment of the present invention, a method of operating a memory cell is provided. The memory cell includes a substrate having a protruding part, a top bit line located in a top portion of the protruding part, a first bottom bit line and a second bottom bit line located in the substrate respectively beside the protruding part, a word line located on the substrate and crossing over the first and second bottom bit lines, and a charge-storage layer located between the word line and the substrate. The memory cell has a first storage region, a second storage region, a third storage region and a fourth storage region located in the charge-storage layer, the first storage region and the second storage region are respectively adjacent to a lower portion and an upper portion of the protruding part at a side of the first bottom bit line, the third storage region and the fourth storage region are respectively adjacent to a lower portion and an upper portion of the protruding part at a side of the second bottom bit line, and the second storage region and the third storage region are regarded as a top storage region. The operation method includes programming the top storage region of the memory cell as described below. First, a first positive voltage is applied to the word line. Thereafter, a second positive voltage is applied to the top bit line. Afterwards, a bottom voltage is applied to the first and second bottom bit lines respectively.

According to an embodiment of the present invention, the first positive voltage is 8 V to 12 V, the second positive voltage is 3 V to 5 V, and the bottom voltage is OV, for example.

According to an embodiment of the present invention, the method further includes programming the first storage region of the memory cell as described below. First, a third positive voltage is applied to the word line. Thereafter, a top voltage is applied to the top bit line. Afterwards, a fourth positive voltage is applied to the first bottom bit line.

According to an embodiment of the present invention, the third positive voltage is 8 V to 12 V, the fourth positive voltage is 3 V to 5 V, and the top voltage is 0 V, for example.

According to an embodiment of the present invention, the method further includes reading the top storage region of the memory cell as described below. First, a seventh positive voltage is applied to the word line. Thereafter, 0 V is applied to the top bit line. Afterwards, an eighth positive voltage is applied to the first bottom bit line.

According to an embodiment of the present invention, the seventh positive voltage is 2 V to 8 V, and the eighth positive voltage is 1 V to 2 V, for example.

According to an embodiment of the present invention, the method further includes reading the top storage region of the memory cell as described below. First, an eleventh positive voltage is applied to the word line. Thereafter, 0 V is applied to the top bit line. Afterwards, a twelfth positive voltage is applied to the first bottom bit line. Further, a thirteenth positive voltage is applied to the second bottom bit line.

According to an embodiment of the present invention, the eleventh positive voltage is 2 V to 8 V, the twelfth positive voltage is 1 V to 2 V, and the thirteenth positive voltage is 1 V to 2 V, for example.

According to an embodiment of the present invention, the method further includes reading the first storage region of the memory cell as described below. First, a fourteenth positive voltage is applied to the word line. Thereafter, a fifteenth positive voltage is applied to the top bit line. Afterwards, 0 V is applied to the first bottom bit line.

According to an embodiment of the present invention, the fourteenth positive voltage is 2 V to 8 V, and the fifteenth positive voltage is 1 V to 2 V, for example.

According to an embodiment of the present invention, the method further includes erasing the top storage region of the memory cell as described below. First, a first negative voltage is applied to the word line. Thereafter, an eighteenth positive voltage is applied to the top bit line. Afterwards, the first and second bottom bit lines are floated.

According to an embodiment of the present invention, the first negative voltage is −4 V to −7 V, and the eighteenth positive voltage is 3 V to 6 V, for example.

According to an embodiment of the present invention, the method further includes erasing the first storage region of the memory cell as described below. First, a second negative voltage is applied to the word line. Thereafter, the top bit line is floated. Afterwards, a nineteenth positive voltage is applied to the first bottom bit line.

According to an embodiment of the present invention, the second negative voltage is −4 V to −7 V, and the nineteenth positive voltage is 3 V to 6 V, for example.

In view of the above, according to the method of operating a memory cell of the present invention, when the second storage region and the third storage region of the memory cell are programmed, 0 V is applied the first and second bottom bit lines respectively, so that the second storage region and the third storage region are in the same storage state and regarded as a top storage region. Therefore, the purpose of storing three bits in a single memory cell is effectively achieved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
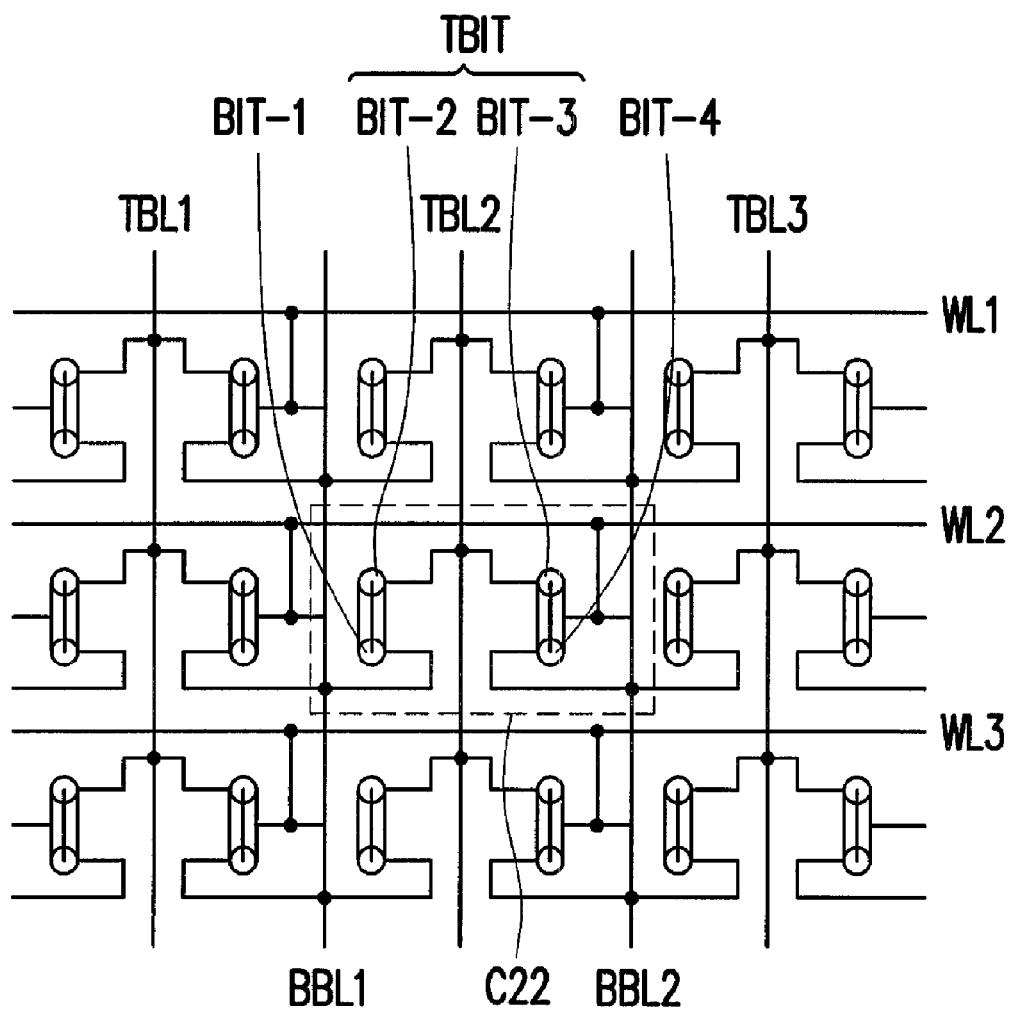
FIG. 1 illustrates a simplified circuit of a memory according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
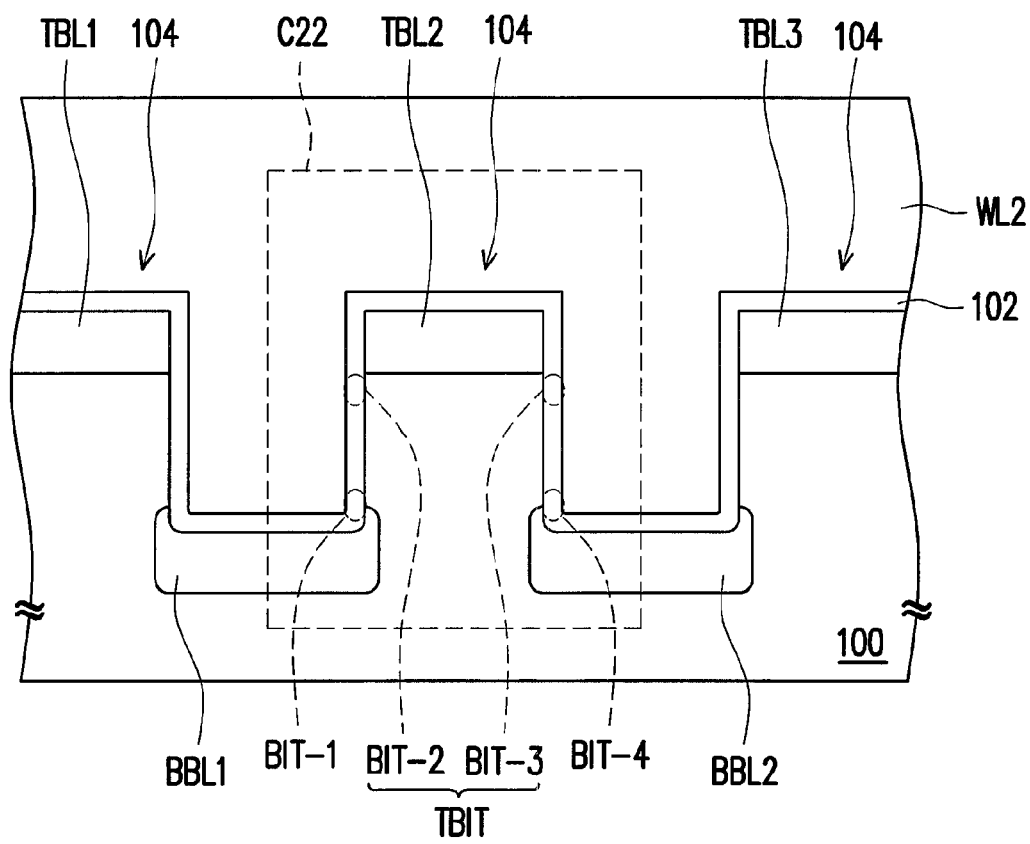
FIG. 2 illustrates a cross-sectional view of the memory cell C22 in FIG. 1.

FIG. 1 illustrates a simplified circuit of a memory according to an embodiment of the present invention. FIG. 2 illustrates a cross-sectional view of the memory cell C22 in FIG. 1.

Referring to FIG. 1, the memory array includes top buried bit lines TBL1, TBL2 and TBL3; bottom buried bit lines BBL1 and BBL2; and word lines WL1, WL2 and WL3. The top buried bit lines TBL1, TBL2 and TBL3 and the bottom buried bit lines BBL1 and BBL2 are arranged alternately and in parallel. The word lines WL1, WL2 and WL3 cross over the top buried bit lines TBL1, TBL2 and TBL3 and the bottom buried bit lines BBL1 and BBL2. Further, a memory cell is located in the area where two adjacent bottom buried bit lines and one word line are crossed. For example, the memory cell C22 is located in the area where the bottom buried bit lines BBL1 and BBL2 and the word line WL2 are crossed.

The structure of the memory cell C22 are illustrated as referred to FIGS. 1 and 2. As shown in FIGS. 1 and 2, the memory cell C22 includes a substrate 100, a top buried bit line TBL2, bottom buried bit lines BBL1 and BBL2, a word line WL2 and a charge-storage layer 102. The substrate 100 has a protruding part 104. The substrate 100 may be a silicon substrate. The top buried bit line TBL2 is located in a top portion of the protruding part 104. The top buried bit line TBL2 may be a buried doped region. The bottom buried bit lines BBL1 and BBL2 are located in the substrate 100 respectively beside the protruding part 104. The bottom buried bit lines BBL1 and BBL2 may be buried doped regions. The word line WL2 is located on the substrate 100 and crosses over the bottom buried bit lines BBL1 and BBL2. The charge-storage layer 102 is located between the word line WL2 and the substrate 100. The charge-storage layer 102 may be a single-layer structure of a silicon nitride layer or a multiple-layer structure of a silicon oxide-silicon nitride-silicon oxide (ONO) composite layer.

Further, the memory cell C22 has a first storage region BIT-1, a second storage region BIT-2, a third storage region BIT-3 and a fourth storage region BIT-4 in the charge-storage layer 102. The first storage region BIT-1 and the second storage region-2 are respectively adjacent to a lower portion and an upper portion of the protruding part 104 at a side of the bottom buried bit line BBL1, and the third storage region BIT-3 and the fourth storage region BIT-4 are respectively adjacent to a lower portion and an upper portion of the protruding part 104 at a side of the bottom buried bit line BBL2. The first storage region BIT-1 and the fourth storage region BIT-4 can respectively store one bit of data, and the second storage region BIT-2 and the third storage region BIT-3 are regarded as a top storage region TBIT for storing one bit of data. Therefore, the purpose of storing three bits in a single memory cell is achieved.

The method of operating the memory cell C22 is exemplified to illustrate the operation method of the present invention in the following. Table 1 is the summary table of the operation voltages when the memory cell C22 is operated in the present embodiment.

TABLE 1

Unit: voltage

| | Operation mode | | | | | | | | | | |
|---|---|---|---|---|---|---|---|---|---|---|---|
| | Program | | | Read | | | | | Erase | | |
| | | | | TBIT | TBIT | TBIT | | | | | |
| Bit | TBIT | BIT-1 | BIT-4 | (method 1) | (method 2) | (method 3) | BIT-1 | BIT-4 | TBIT | BIT-1 | BIT-4 |
| WL1 | 0 | 0 | 0 | 0 | 0 | 0 | 0 | 0 | 0 | 0 | 0 |
| WL2 | 8 to 12 | 8 to 12 | 8 to 12 | 2 to 8 | 2 to 8 | 2 to 8 | 2 to 8 | 2 to 8 | −4 to −7 | −4 to −7 | −4 to −7 |

TABLE 1-continued

Unit: voltage

| Bit | Program TBIT | Program BIT-1 | Program BIT-4 | Read TBIT (method 1) | Read TBIT (method 2) | Read TBIT (method 3) | Read BIT-1 | Read BIT-4 | Erase TBIT | Erase BIT-1 | Erase BIT-4 |
|---|---|---|---|---|---|---|---|---|---|---|---|
| WL3 | 0 | 0 | 0 | 0 | 0 | 0 | 0 | 0 | 0 | 0 | 0 |
| TBL1 | F* | F | F | F | F | F | F | F | F | F | F |
| BBL1 | 0 | 3 to 5 | F | 1 to 2 | F | 1 to 2 | 0 | F | F | 3 to 6 | F |
| TBL2 | 3 to 5 | 0 | 0 | 0 | 0 | 0 | 1 to 2 | 1 to 2 | 3 to 6 | F | F |
| BBL2 | 0 | F | 3 to 5 | F | 1 to 2 | 1 to 2 | F | 0 | F | F | 3 to 6 |
| TBL3 | F | F | F | F | F | F | F | F | F | F | F |

*F means floating.

Programming Operation

Referring to FIGS. 1, 2 and Table 1, the operation method of the present invention includes programming the top storage region TBIT of the memory cell C22. The method of programming the top storage region TBIT of the memory cell C22 includes the following steps. First, a first positive voltage is applied to the word line WL2. Thereafter, a second positive voltage is applied to the top buried bit line TBL2. Afterwards, a bottom voltage is applied to the bottom buried bit lines BBL1 and BBL2 respectively. In an embodiment of the present invention, the first positive voltage is 8 V to 12 V, the second positive voltage is 3 V to 5 V, and the bottom voltage is 0 V, for example. Further, 0 V is applied to the word lines WL1 and WL3, and the top buried bit lines TBL1 and TBL3 are floated, for example.

The operation method of the present invention includes programming the first storage region BIT-1 of the memory cell C22. The method of programming the first storage region BIT-1 of the memory cell C22 includes the following steps. First, a third positive voltage is applied to the word line WL2. Thereafter, a top voltage is applied to the top buried bit line TBL2. Afterwards, a fourth positive voltage is applied to the bottom buried bit line BBL1. In an embodiment of the present invention, the third positive voltage is 8 V to 12 V, the fourth positive voltage is 3 V to 5 V, and the top voltage is 0 V, for example. Further, 0 V is applied to the word lines WL1 and WL3 respectively, and the bottom buried bit line BBL2 and the top buried bit lines TBL1 and TBL3 are floated, for example.

The operation method of the present invention includes programming the fourth storage region BIT-4 of the memory cell C22. The method of programming the fourth storage region BIT-4 of the memory cell C22 includes the following steps. First, a fifth positive voltage is applied to the word line WL2. Afterwards, a top voltage is applied to the top buried bit line TBL2. Afterwards, a sixth positive voltage is applied to the bottom buried bit line BBL2. In an embodiment of the present invention, the fifth positive voltage is 8 V to 12 V, the sixth positive voltage is 3 V to 5 V, and the top voltage is 0 V, for example. Further, 0 V is applied to the word lines WL1 and WL3 respectively, and the bottom buried bit line BBL1 and the top buried bit lines TBL1 and TBL3 are floated, for example.

Reading Operation

Referring to FIGS. 1 and 2 and Table 1, the operation method of the present invention includes reading the top storage region TBIT of the memory cell C22. The second storage region BIT-2 and the third storage region BIT-3 are regarded as a top storage region TBIT, so that the storage state of the top storage region TBIT can be obtained by performing the reading operation to the second storage region BIT-2, to the third storage region BIT-3, or to the second storage region BIT-2 and the third storage region BIT-3 simultaneously.

The first method (method 1) of reading the top storage region TBIT of the memory cell C22 includes the following steps. First, a seventh positive voltage is applied to the word line WL2. Thereafter, 0 V is applied to the top buried bit line TBL2. Afterwards, an eighth positive voltage is applied to the bottom buried bit line BBL1. In an embodiment of the present invention, the seventh positive voltage is 2 V to 8 V, and the eighth positive voltage is 1 V to 2 V, for example. Further, 0 V is applied to the word lines WL1 and WL3 respectively, and the bottom buried bit line BBL2 and the top buried bit lines TBL1 and TBL3 are floated, for example.

The second method (method 2) of reading the top storage region TBIT of the memory cell C22 includes the following steps. First, a ninth positive voltage is applied to the word line WL2. Thereafter, 0 V is applied to the top buried bit line TBL2.

Afterwards, a tenth positive voltage is applied to the bottom buried bit line BBL2. In an embodiment of the present invention, the ninth positive voltage is 2 V to 8 V, and the tenth positive voltage is 1 V to 2 V, for example. Further, 0 V is applied to the word lines WL1 and WL3 respectively, and the bottom buried bit line BBL1 and the top buried bit lines TBL1 and TBL3 are floated, for example.

The third method (method 3) of reading the top storage region TBIT of the memory cell C22 includes the following steps. First, an eleventh positive voltage is applied to the word line WL2. Thereafter, 0 V is applied to the top buried bit line TBL2. Afterwards, a twelfth positive voltage is applied to the bottom buried bit line BBL1. Further, a thirteenth positive voltage is applied to the bottom buried bit line BBL2. In an embodiment of the present invention, the eleventh positive voltage is 2 V to 8 V, the twelfth positive voltage is 1 V to 2 V, and the thirteenth positive voltage is 1 V to 2 V, for example. In addition, 0 V is applied to the word lines WL1 and WL3 respectively, and the top buried bit lines TBL1 and TBL3 are floated, for example.

The operation method of the present invention includes reading the first storage region BIT-1 of the memory cell C22. The method of reading the first storage region BIT-1 of the memory cell C22 includes the following steps. First, a fourteenth positive voltage is applied to the word line WL2. Thereafter, a fifteenth positive voltage is applied to the top buried bit line TBL2. Afterwards, 0 V is applied to the bottom buried bit line BBL1. In an embodiment of the present invention, the fourteenth positive voltage is 2 V to 8 V, and the fifteenth positive voltage is 1 V to 2 V, for example. Further, 0 V is applied to the word lines WL1 and WL3 respectively, and the bottom buried bit line BBL2 and the top buried bit lines TBL1 and TBL3 are floated, for example.

The operation method of the present invention includes reading the fourth storage region BIT-4 of the memory cell C22. The method of reading the fourth storage region BIT-4 of the memory cell C22 includes the following steps. First, a sixteenth positive voltage is applied to the word line WL2. Thereafter, a seventeenth positive voltage is applied to the top buried bit line TBL2. Afterwards, 0 V is applied to the bottom buried bit line BBL2. In an embodiment of the present invention, the sixteenth positive voltage is 2 V to 8 V, and the seventeenth positive voltage is 1 V to 2 V, for example. Further, 0 V is applied to the word lines WL1 and WL3 respectively, and the bottom buried bit line BBL1 and the top buried bit lines TBL1 and TBL3 are floated, for example.

Erasing Operation

Referring to FIGS. 1 and 2 and Table 1, according to an embodiment of the present invention, the method of operating the memory cell further includes erasing the top storage region TBIT of the memory cell C22. The method of erasing the top storage region TBIT of the memory cell C22 includes the following steps. First, a first negative voltage is applied to the word line WL2. Thereafter, an eighteenth positive voltage is applied to the top buried bit line TBL2. Afterwards, the bottom buried bit lines BBL1 and BBL2 are floated. In an embodiment of the present invention, the first negative voltage is −4 V to −7 V, and the eighteenth positive voltage is 3 V to 6 V, for example. Further, 0 V is applied to the word lines WL1 and WL3 respectively, and the top buried bit lines TBL1 and TBL3 are floated, for example.

The operation method of the present invention includes erasing the first storage region BIT-1 of the memory cell C22. The method of erasing the first storage region BIT-1 of the memory cell C22 includes the following steps. First, a second negative voltage is applied to the word line WL2. Thereafter, the top buried bit line TBL2 is floated. Afterwards, a nineteenth positive voltage is applied to the bottom buried bit line BBL1. In an embodiment of the present invention, the second negative voltage is −4 V to −7 V, and the nineteenth positive voltage is 3 V to 6 V, for example. Further, 0 V is applied to the word lines WL1 and WL3 respectively, and the bottom buried bit line BBL2 and the top buried bit lines TBL1 and TBL3 are floated, for example.

The operation method of the present invention includes erasing the fourth storage region BIT-4 of the memory cell C22. The method of erasing the fourth storage region BIT-4 of the memory cell C22 includes the following steps. First, a third negative voltage to the word line WL2. Thereafter, the top buried bit line TBL2 is floated. Afterwards, a twentieth positive voltage is applied to the bottom buried bit line BBL2. In an embodiment of the present invention, the third negative voltage is −4 to −7 V, and the twentieth positive voltage is 3 to 6 V. Further, 0 V is applied to the word lines WL1 and WL3 respectively, and the bottom buried bit line BBL1 and the top buried bit lines TBL1 and TBL3 are floated, for example.

In view of the above, when the second storage region BIT-2 and the third storage region BIT-3 of the memory cell C22 are programmed, 0 V is applied to the bottom buried bit lines BBL1 and BBL2 respectively, so that the second storage region BIT-2 and the third storage region BIT-3 are programmed to be in the same storage state, an thus, the second storage region BIT-2 and the third storage region BIT-3 are regarded as a top storage region TBIT, and interference between the second storage region BIT-2 and the third storage region BIT-3 is not observed. Therefore, three bits are stored in a single memory cell C22.

Further, when the second storage region BIT-2 and the third storage region BIT-3 of the memory cell C22 are programmed, 0 V is applied to the bottom buried bit lines BBL1 and BBL2 respectively, so that the bottom buried bit lines BBL1 and BBL2 are not coupled with the voltage applied to top buried bit line TBL2. Therefore, interference to the storage states of the first storage region BIT-1 and the fourth storage region BIT-4 is avoided, so as to obtain a 3-bit-per-cell memory having a top storage region TBIT, a first storage region BIT-1 and a fourth storage region-4 which are not interfered with each other.

In summary, in the operation method of the present invention, the second storage region and the third storage region of the vertical memory cell can be regarded as a top storage region, so that the purpose of storing three bits in a single memory cell is achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of operating a memory cell, wherein the memory cell comprises a substrate having a protruding part, a top bit line located in a top portion of the protruding part, a first bottom bit line and a second bottom bit line located in the substrate respectively beside the protruding part, a word line located on the substrate and crossing over the first and second bottom bit lines, and a charge-storage layer located between the word line and the substrate, and wherein the memory cell has a first storage region, a second storage region, a third storage region and a fourth storage region located in the charge-storage layer, the first storage region and the second storage region are respectively adjacent to a lower portion and an upper portion of the protruding part at a side of the first bottom bit line, the third storage region and the fourth storage region are respectively adjacent to a lower portion and an upper portion of the protruding part at a side of the second bottom bit line, and the second storage region and the third storage region are regarded as a top storage region, the method comprising programming the top storage region of the memory cell, comprising:
applying a first positive voltage to the word line;
applying a second positive voltage to the top bit line; and
respectively applied a bottom voltage to the first and second bottom bit lines; and the method comprising programming the first storage region of the memory cell, comprising:
applying a third positive voltage to the word line;
applying a top voltage to the top bit line; and
applying a fourth positive voltage to the first bottom bit line.

2. The method of claim 1, wherein the first positive voltage is 8 V to 12 V, and the second positive voltage is 3 V to 5 V.

3. The method of claim 1, wherein the bottom voltage is 0 V.

4. The method of claim 1, wherein the third positive voltage is 8 V to 12 V, and the fourth positive voltage is 3 V to 5 V.

5. The method of claim 1, wherein the top voltage is 0 V.

6. The method of claim 1, further comprising reading the top storage region of the memory cell, comprising:
applying a seventh positive voltage to the word line;
applying 0 V to the top bit line; and applying an eighth positive voltage to the first bottom bit line.

7. The method of claim 6, wherein the seventh positive voltage is 2 V to 8 V, and the eighth positive voltage is 1 V to 2 V.

8. The method of claim 1, further comprising reading the top storage region of the memory cell, comprising:
applying an eleventh positive voltage to the word line;
applying 0 V to the top bit line;
applying a twelfth positive voltage to the first bottom bit line; and
applying a thirteenth positive voltage to the second bottom bit line.

9. The method of claim 8, wherein the eleventh positive voltage is 2 V to 8 V, the twelfth positive voltage is 1 V to 2 V, and the thirteenth positive voltage is 1 V to 2 V.

10. The method of claim 1, further comprising reading the first storage region of the memory cell, comprising:
applying a fourteenth positive voltage to the word line;
applying a fifteenth positive voltage to the top bit line; and
applying 0 V to the first bottom bit line.

11. The method of claim 10, wherein the fourteenth positive voltage is 2 V to 8 V, and the fifteenth positive voltage is 1 V to 2 V.

12. The method of claim 1, further comprising erasing the top storage region of the memory cell, comprising:
applying a first negative voltage to the word line;
applying an eighteenth positive voltage to the top bit line; and
floating the first and second bottom bit lines.

13. The method of claim 12, wherein the first negative voltage is −4 V to −7 V, and the eighteenth positive voltage is 3 V to 6 V.

14. The method of claim 1, further comprising erasing the first storage region of the memory cell, comprising:
applying a second negative voltage to the word line;
floating the top bit line; and
applying a nineteenth positive voltage to the first bottom bit line.

15. The method of claim 14, wherein the second negative voltage is −4 V to −7 V, and the nineteenth positive voltage is 3 V to 6 V.

* * * * *